United States Patent [19]

Gluck et al.

[11] Patent Number: 4,923,828
[45] Date of Patent: May 8, 1990

[54] GASEOUS CLEANING METHOD FOR SILICON DEVICES

[75] Inventors: Ronald Gluck; Paul L. Roselle, both of Rochester, N.Y.

[73] Assignee: Eastman Kodak Company, Rochester, N.Y.

[21] Appl. No.: 390,314

[22] Filed: Aug. 7, 1989

Related U.S. Application Data

[63] Continuation-in-part of Ser. No. 376,483, Jul. 7, 1989.

[51] Int. Cl.$^5$ .................... H01L 21/00; H01L 21/02; H01L 21/30; H01L 21/306
[52] U.S. Cl. .................... 437/225; 437/228; 437/233; 437/234; 148/DIG. 17; 156/643; 156/646; 252/372; 252/374
[58] Field of Search ............... 437/225, 237, 239, 242, 437/244, 228, 233, 234; 148/DIG. 17; 156/643, 646, 662; 252/372, 374

[56] References Cited

U.S. PATENT DOCUMENTS

| | | | |
|---|---|---|---|
| 4,159,917 | 7/1979 | Gluck | 148/1.5 |
| 4,849,375 | 7/1989 | Gluck et al. | 437/225 |

OTHER PUBLICATIONS

J. Ruzyllo et al., J. Electrochemical Society, vol. 136, No. 5, May, 1989, pp. 1474–1476.
Proceedings of the Seventh Symposium on Plasma Processing, vol. 88-22, The Electrochemical Society, Pennington, N.J.,–1988, p. 151, G. S. Oehrlein et al.
K. R. Ryan and I. C. Plumb, Plasma Chemistry and Plasma Processes, vol. 4, No. 3, 1984.
d'Agostino et al., Plasma Chemistry and Plasma Processes, vol. 4, No. 1, 1984.
Ryan, K., Plasma Chemistry and Plasma Processes, vol. 4, No. 3, 1984.
d'Agostino, R., Plasma Chemistry and Plasma Processes, vol. 4, No. 1, 1984.
Ghandhi, S., VLSI Fabrication Principles, Chap. 9, Wiley & Sons, 1983.
Sze, S., VLSI Technology, Chap. 8, McGraw-Hill, 1983.

*Primary Examiner*—Brian E. Hearn
*Assistant Examiner*—B. Everhart
*Attorney, Agent, or Firm*—Raymond L. Owens

[57] ABSTRACT

A method for cleaning metallic impurities from a silicon surface of a semiconductor device is described. The first method includes, in sequence, the steps of:

(a) exposing the silicon surface for a first time to a plasma afterglow anhydrous cleaning gas mixture containing nitric oxide and hydrogen chloride together with an inert carrier gas to remove metallic impurities, and then either;

(b) exposing that surface for a second time to a plasma afterglow gas mixture of a fluorocarbon gas and hydrogen or carbon dioxide to remove the silicon oxynitrochloride film which is formed by step (a), leaving a fluorocarbon polymer film; and (c) exposing the surface for a third time to a plasma afterglow gas of oxygen to remove the fluorocarbon polymer film deposited in step (b); or (d) exposing that surface for a second time to a plasma afterglow gas mixture of inorganic fluorine compound gas, $O_2$ and carrier gas to remove the silicon oxynitrochlorine film which is formed in step (a).

6 Claims, 1 Drawing Sheet

U.S. Patent    May 8, 1990    4,923,828
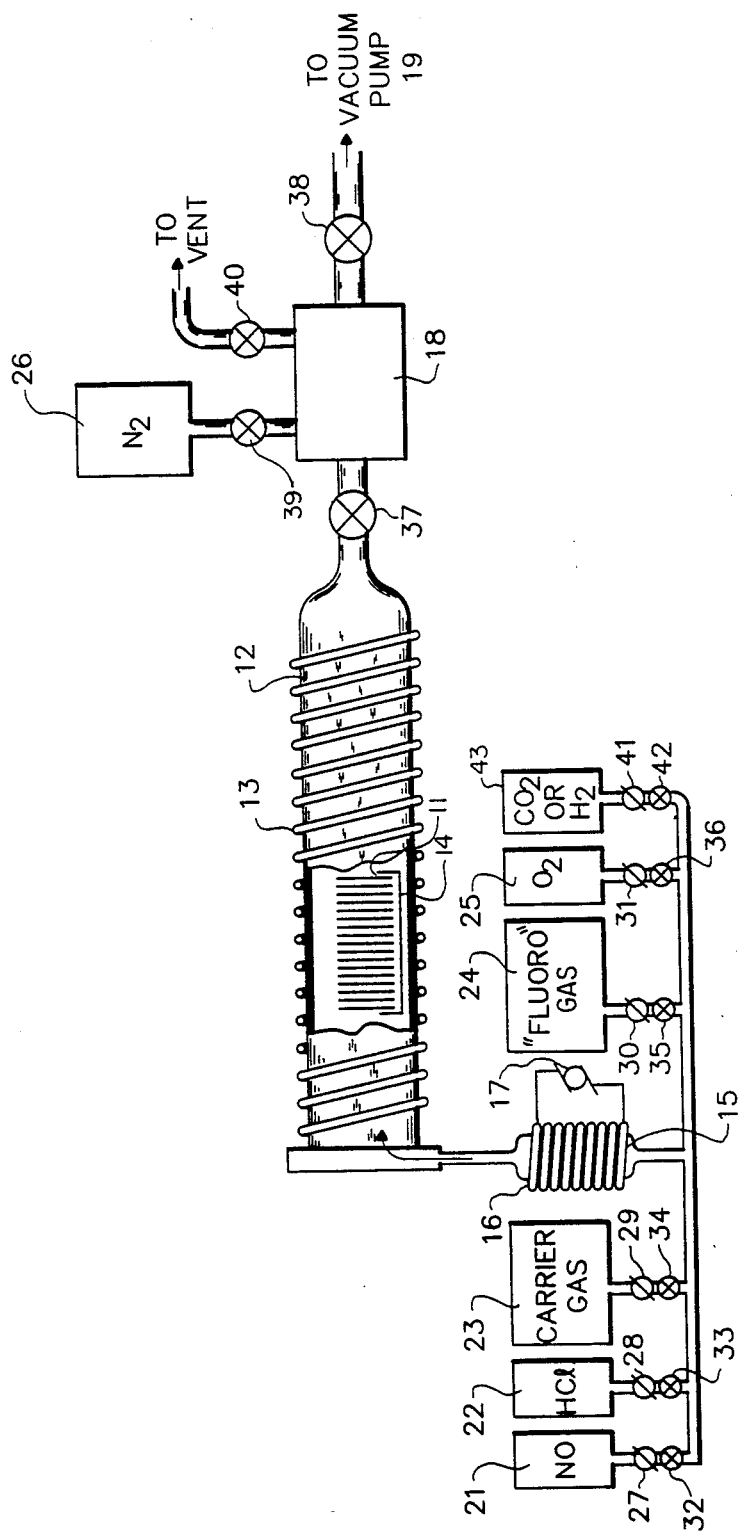

GASEOUS CLEANING METHOD FOR SILICON DEVICES

CROSS REFERENCE TO RELATED APPLICATION

This is a continuation in part of the earlier filed application Ser. No. 376,483, filed July 7, 1989.

Reference is made to commonly assigned U.S. Ser. No. 289,062 filed Dec. 23, 1988 to Ronald M. Gluck and David P. Hamblen.

1. Field of the Invention

This invention relates to an improved method for cleaning the surfaces of silicon devices.

2. Background Art

The manufacture of semiconductor (silicon) devices such as silicon integrated circuits and charge coupled devices requires that impurities be kept from residing on the surface of such devices. Impurities such as copper, iron and gold are especially troublesome since they form undesirable charge traps at device surfaces, and can diffuse into the silicon bulk to form hot spots or noise sources, which adversely affect device performance.

Devices formed from a silicon wafer employing processing steps generally include:
(a) thermal diffusion of dopants into the silicon; and
(b) the thermal growth of an oxide over regions of the silicon. Before each thermal step, it is customary to clean the silicon wafer. Typically this is done by: exposing the wafer to aqueous solutions of ammonium hydroxide and hydrogen peroxide; rinsing, for a first time, the wafer with deionized water and exposing the wafer to aqueous solutions of hydrochloric acid and hydrogen peroxide; and rinsing, for a second time, the wafer with deionized water. Such a technique, while working to clean away trace amounts of impurities, leaves something to be desired, primarily because it requires handling and processing by wet solutions; and because it takes a fair amount of processing time. Also, particulates present in all liquid reagents tend to become attached to the wafers, where they can create shorts and opens on finely patterned structures.

U.S. Pat. No. 4,159,917 discloses a gaseous cleaning process in which nitric oxide and anhydrous hydrochloric acid are used together with a carrier gas of molecular nitrogen in a temperature range of 850° to 1100° C. While quite effective to remove metallic impurities from the wafers, it has a drawback in that an undesired reaction occurs simultaneously with the silicon in which a film of approximately 75 Å thickness containing silicon, oxygen, nitrogen and chlorine is formed (silicon oxynitrochloride). This film prevents a more efficient cleaning of silicon surfaces and frequently inhibits subsequent operations, such as thermal oxidation and dopant diffusion.

J. Ruzyllo et al, in a recent article (J. Electrochem. Soc. Vol. 136, No. May 5, 1989 pages 1474–1476) compares the effect of dry wafer cleaning using remote gaseous plasma with a conventional wet cleaning process on electrical parameters of MOS devices. He specifically uses a plasma afterglow gas composed of $NF_3$, $O_2$ and Ar to etch residual oxide and a plasma afterglow gas composed of HCl and Ar to remove metallic impurities. This dry cleaning produces devices with comparable interface traps, flatband voltage and minority carrier lifetime to wet cleaned devices. However, dry cleaned MOS capacitors breakdown at lower electric field strengths than wet cleaned counterparts. This dry clean process removes impurities as well as the wet clean process but the former process causes localized silicon pitting, which results in surface roughness and reduces dielectric strength of the capacitors. G. S. Dehrein et al in a recent article (Proceedings of the Seventh Synposium on Plasma Processing, Vol. 88-22, The Electrochemical Society, Pennington N.J., 1988, page 151) refers to the use of plasmas of $CF_4$ or $CHF_3$ mixed with hydrogen or $CO_2$, respectively, for the etching of silicon dioxide films while being selective to silicon films. A fluoropolymer is deposited on the silicon surface from the $CF_4/O_2$ or $CHF_3/CO_2$ plasma. This fluoropolymer is removed with a standard of oxygen plasma. During this oxygen etch of the fluoropolymer, a thin oxide grows on the silicon surface. The standard planar of plasma can cause photon damage, ion damage and electrostatic damage to the silicon device being etched.

BRIEF DESCRIPTION OF THE DRAWING

The drawing schematically illustrates in cross section apparatus for practicing this invention.

SUMMARY OF THE INVENTION

It is an object of this invention to effectively remove metallic impurities from the surface of a silicon device. This invention makes use of an afterglow gas composed of a mixture of nitric oxide, anhydrous hydrochloric acid and an inert carrier gas such as nitrogen to remove metallic impurities from silicon wafers. The undesired by-product film of silicon oxynitrochloride is removed by using an afterglow gas mixture of $CH_4$ and $H_2$ or $CHF_3$ and $CO_2$ which forms free radicals which will selectively etch the silicon oxynitrochloride, without substantially attacking the silicon. However, a thin layer of fluorocarbon polymer is formed on the silicon surface during this process which must be removed prior to typical fabrication procedures such as oxidation or diffusion. This fluorocarbon polymer layer is removed with an afterglow oxygen treatment, which leaves a thin desirable protective layer of silicon dioxide.

Alternatively, the undesired by-product film of silicon oxynitrochloride can be removed using an afterglow gas mixture of an inorganic fluorine compound gas, $O_2$ and carrier gas. Use of this mixture is less selective for silicon oxynitrochloride film removal, but the formation of a fluoropolymer film is avoided and the cleaning process is reduced to two steps.

Afterglow gas is defined herein as a gas which has been excited into a plasma state with an electrical potential and which is subsequently removed from the electrical potential source but which contains excited chemical species (free radicals) of sufficient lifetime to produce enhanced chemical reactivity downstream in the wafer cleaning chamber.

Mode Of Carrying Out the Invention

For the purposes of this invention the silicon surfaces to be cleaned should be free of gross levels of organic contamination and particulates. Commercial organic stripping equipment featuring oxygen plasma or afterglow gas are available for organics and commercial wafer scrubbing equipment is available for removing particulates.

Referring to the drawing, a system for practicing the invention employs a source 21 of nitric oxide, a source 22 of anhydrous hydrochloric acid, a source 23 of inert carrier gas such as nitrogen, argon etc., a source 24 of carbon tetrafluoride or $CHF_3$ or an inorganic fluorine compound gas such as $NF_3$, a source 25 of oxygen and a source 26 of nitrogen, and a source 43 of either $H_2$ or $CO_2$. Adjustable valves 27, 28, 29, 30, 31 and 41 regulate the flow of gases from their corresponding sources. On off solenoid values 32, 33, 34, 35, 36, 39, 40 and 42 are used to initiate and terminate gas flows. Silicon wafers (11) in quartz boats (14) are introduced into the quartz wafer cleaning chamber (12) with a suitable loading/unloading mechanism such as a cantelevered system (not shown). Resistive heating of the wafers is provided by heating elements (13). A plasma excitation electrode (16), connected to a source of electrical potential (17), is used to create a gaseous plasma in the generation chamber (15). Sources of the plasma generating electrical potential can be an applied high voltage DC field or a high frequency electromagnetic field. For this later case the frequency can vary from low (Kilohertz) to high (microwave or Gigahertz) range. Reduced pressure operation is obtained using a mechanical vacuum pump 19, protected from corrosive reagents by a cryotrap 18. Vacuum valves 37 and 38 permit system pumping or trap purging. It will be understood to those skilled in the art that appropriate temperature controls and solenoid controls, not shown in the schematic can be employed. Also not shown on the schematic are high purity gas filters 99.99% efficient for particles 0.02 microns and larger which are located between the sources and the adjustable valves.

The cleaning process involves a minimum of two steps performed in sequence. In the first step a), silicon wafers (11), held in quartz wafer carrier (14), are loaded into wafer cleaning chamber (12). A mechanical vacuum pump (19) is used to evacuate the system by closing solenoids 39 and 40 and opening vacuum valves 37 and 38. A cryotrap with solenoids 39 and 40 closed is used to trap corrosive vapors resident from the first step. Adjustable valves 27, 28 and 29 are set to deliver nitric oxide from source 27, anhydrous hydrochloric acid from source 28 and inert carrier gas from source 29. Solenoid valves 32, 33 and 34 are opened to initiate gas flow. The cleaning gas is allowed to flow through the plasma generation chamber 15 which is powered by electrical potential source 17 through the excitation electrodes 16. A gaseous plasma is formed which decays in transit from the generation chamber 15, to the wafer cleaning chamber 12. The flow rates are adjusted so the free radical species formed in the generation chamber are still present when the gases flow through the wafer cleaning chamber. After sufficient time has passed to create a 75A-80A film of silicon oxynitrochloride on the surface of the wafers, solenoid valves 32, 33 and 34 are closed and residual cleaning gas is purged from the system with the mechanical vacuum pump 19.

In the second step, (b), of the cleaning process adjustable valves 29, 30, 31 and 41 are set to deliver carrier gas such as argon from source 23, carbon tetrafluoride or $CHF_3$ or $NF_3$ from source 24, $O_2$ from source 25 and either $H_2$ or $CO_2$ from source 43. Solenoid valves 34, 35 and 36 or 35 and 42 are opened to initiate gas flows. The gas flows through the powered plasma generation chamber to form a gaseous plasma mixture which decays to afterglow gas in transit to the wafer cleaning chamber. The mixed gas flow is continued until the silicon oxynitrochloride layer is removed. Next solenoid valves 36, 34 and 35 or 35 and 42 are closed and the residual gases are purged from the system. In the third step, (c), if needed, of the cleaning process adjustable valve 31, is set to deliver oxygen from source 25 and solenoid valve 36 is opened to initiate gas flow. The gas proceeds through the powered plasma generation chamber to form a gaseous plasma which decays to afterglow gas in transit to the wafer cleaning chamber. Oxygen flow is continued until the fluorocarbon polymer layer left by the second step is removed and a thin oxide layer is formed on the silicon surface. If inorganic fluorine compound/$O_2$/carrier afterglow gas is used in step (b), step (c) is omitted. Solenoid valve 36 is closed and residual gases purged from the system. Vacuum valve 37 is closed and the system is backfilled with inert carrier gas by opening solenoid 34. The cryotrap is purged of condensed vapors by closing vacuum valve 38 and introducing a flow of nitrogen from source 26 by opening solenoids 39 and 40 while warming the trap from cryogenic temperature.

The cleaning efficiency of the two step method can be improved by repeating the above steps (a) and (b) at least one more time. The cleaning efficiency of the three step method can be improved by repeating the above steps (a), (b) and (c) at least one more time. The cleaning efficiency at step (a) can be impaired by the growth of the silicon oxynitrochloride film, which tends to bury the impurities, restricting access of cleaning gas and exit of volatile impurities. By removing the silicon oxynitrochloride at step (b) and fluorocarbon polymer at step (c), if needed, buried impurities are again made accessible for removal, so repetition of steps (a) and (b) or (a), (b) and (c) improves the cleaning efficiency of the process. The presence of a thin oxide after step (c) has been shown not to be a barrier for reactive cleaning gases.

Low temperature reactions made possible by the free radicals in the afterglow gases are considered advantageous in restricting thermal diffusion of surface impurities during steps (a) and (b) and would enhance the cleaning efficiency by allowing the cleaning gases greater access time to the impurities.

One advantage of using an afterglow gas as compared to a gaseous plasma is that species such as energeric ions and free electrons present in plasma are absent from the afterglow gas. Also, UV photons emitted in the plasma are excluded. Thus, devices undergoing cleaning during fabrication are protected from potential damage which may be detrimental to their function.

A second advantage of using an afterglow gas is that the apparatus for implementing the cleaning process is simplified and amenable to multiwafer batch application which improves wafer throughput.

This invention eliminates the surface roughness because of the nature of the surface reaction between nitric oxide/hydrochloric acid and silicon. As described in commonly assigned U.S. Pat. No. 4,159,917, a self limiting film of approximately 75A of silicon oxynitrochloric is formed. The self limiting feature controls the extent of the reaction by preventing diffusion of the reactant species through the growing film. Therefore, uncontrolled pitting associated with HCl/Ar afterglow gas is avoided. The surface reaction terminates in a uniform film thickness after the limiting thickness is reached, even though reactive gases are present. By providing an excess amount of reactive gas, a uniform film layer and cleaning effect is produced over all silicon surfaces, negating nonuniformities associated with gaseous concentration variations and loading effects. In contrast, gaseous species such as HCl/Ar, without a self limiting reaction mechanism will be subject to the nonuniformities discussed above, which result in pitting, roughness and the associated reduced dielectric strength of capacitors fabricated on such surfaces.

In addition, U.S. Pat. No. 4,159,917 discusses that the cleaning efficiency of nitric oxide/hydrochloric acid gas mixtures are superior to hydrochloric acid alone. The excited states of the nitric oxide/hydrochloric acid gas mixtures associated with the afterglow will be more efficient in displacing metallic species of a noble nature such as gold, which is considered one of the most difficult impurities to remove.

The surface roughness cited by Ruzyllo et al may also be associated with their residual oxide etch, if the selectivity of the afterglow nitrogen trifluoride/oxygen/argon mixture favors enhanced etching of silicon with respect to silicon dioxide. The selection of afterglow gas mixtures of $CF_4$ and $H_2$ or $CHF_3$ and $CO_2$ in this invention favors the selective etching of silicon oxynitrochloride. The mechanism for the selective etching of the silicon oxynitrochloride is similar to the mechanism of selective etching of silicon dioxide as has been discussed by Ryan, K. R. and Plumb, I. C. (Plasma Chemistry and Plasma Processes, Vol. 4, No. 3, 1984). Ryan states that the selectivity of a $CF_4/H_2$ plasma to silicon is due to the presence of atomic hydrogen in the discharge. The atomic hydrogen acts as a reducing agent on the fluorine free radicals that are responsible for the etching of the silicon while enhancing the production of CFx radicals that preferentially etch oxide. This reduction in the fluorine free radical concentration combined with the increase in the CFx free radical concentration is stated by d'Agostino et al (Plasma Chemistry and Plasma Processes, Vol. 4, No. 1, 1984) to be the main cause of selectivity to silicon. This mechanism is also consistent with the $CHF_3/CO_2$ chemistry since atomic hydrogen is present from the dissociation of the $CHF_3$. However, use of inorganic fluorine compound gas/$O_2$/carrier gas mixtures, while being less selective avoids the formation of fluoropolymer film associated with use of $CH_4$ and $H_2$ or $CHF_3$ and $CO_2$, so its use can simplify cleaning in applications where greater loss of silicon can be tolerated.

The invention has been described in detail with particular reference to a certain preferred embodiment thereof, but it will be understood that variations and modifications can be effected within the spirit and scope of the invention.

What is claimed is:

1. A method for cleaning a silicon semiconductor device in which metallic impurities are removed from a silicon surface of the device, said method comprising, in sequence, the steps of:
    (a) exposing a silicon surface of a device for a first time to a plasma afterglow anhydrous cleaning gas mixture containing nitric oxide and hydrogen chloride together with an inert carrier gas to remove metallic impurities;
    (b) exposing said surface for a second time to a plasma afterglow gas mixture of a fluorocarbon gas and hydrogen or carbon dioxide to remove the silicon oxynitrochloride film which is formed by step (a), leaving a fluorocarbon polymer film; and
    (c) exposing said surface for a third time to a plasma afterglow gas of oxygen to remove the fluorocarbon polymer film deposited in step (b).

2. The method of claim 1 wherein sequence of steps (a), (b) and (c) is repeated at least one more time.

3. The method of claim 1 wherein the fluorocarbon gas is either $CF_4$ or $CHF_3$.

4. A method for cleaning a silicon semiconductor device in which metallic impurities are removed from a silicon surface of the device, said method comprising, in sequence, the steps of:
    (a) exposing a silicon surface of a device for a first time to a plasma afterglow anhydrous cleaning gas mixture containing nitric oxide and hydrogen chloride together with an inert carrier gas to remove metallic impurities;
    (b) exposing said surface for a second time to a plasma afterglow gas mixture of inorganic fluoride compound gas, $O_2$ and carrier gas to remove the silicon oxynitrochloride film which is formed by step (a).

5. The method of claim 4 wherein sequence of steps (a) and (b) is repeated at least one more time.

6. The method of claim 4 where the inorganic fluorine compound gas is $NF_3$ or $SF_6$ and the carrier gas is argon.

* * * * *

UNITED STATES PATENT AND TRADEMARK OFFICE
CERTIFICATE OF CORRECTION

PATENT NO. : 4,923,828
DATED : May 8, 1990
INVENTOR(S) : Ronald Gluck and Paul L. Roselle It is certified that error appears in the above-identified patent and that said Letters Patent is hereby corrected as shown below:

Column 2, line 6, "Dehrein" should read as - -Oehrlein- -;
 line 15, "of" should read as - -rf- -;
 line 18, "of" should read as - -rf- -;
 line 35, "CH$_4$" should read as - -CF$_4$- -.

Column 3, line 10, "values" should read as - -valves- -.

Column 4, line 44, "energeric" should read as - -energetic- -.

Column 5, line 44, "CH$_4$" should read as - -CF$_4$- -.

Signed and Sealed this

Twenty-fifth Day of February, 1992

Attest:

HARRY F. MANBECK, JR.

*Attesting Officer*     *Commissioner of Patents and Trademarks*